United States Patent
Ito et al.

(10) Patent No.: US 11,114,354 B2
(45) Date of Patent: Sep. 7, 2021

(54) PRINTED WIRING BOARD, PRINTED CIRCUIT BOARD, PREPREG

(71) Applicant: Panasonic Intellectual Property Management Co., Ltd., Osaka (JP)

(72) Inventors: Akira Ito, Osaka (JP); Eiichiro Saito, Osaka (JP); Kengo Yamanouti, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 276 days.

(21) Appl. No.: 16/324,199

(22) PCT Filed: Aug. 22, 2017

(86) PCT No.: PCT/JP2017/029840
§ 371 (c)(1),
(2) Date: Feb. 8, 2019

(87) PCT Pub. No.: WO2018/047613
PCT Pub. Date: Mar. 15, 2018

(65) Prior Publication Data
US 2019/0214321 A1    Jul. 11, 2019

(30) Foreign Application Priority Data

Sep. 6, 2016   (JP) .............................. JP2016-173823

(51) Int. Cl.
*H05K 1/00* (2006.01)
*H01L 23/14* (2006.01)
*H01L 23/12* (2006.01)
*H05K 3/46* (2006.01)
(Continued)

(52) U.S. Cl.
CPC ............ *H01L 23/142* (2013.01); *H01L 23/12* (2013.01); *H01L 23/14* (2013.01); *H01L 23/15* (2013.01);
(Continued)

(58) Field of Classification Search
CPC ........ H01L 23/142; H01L 23/12; H01L 23/14; H01L 23/15; H05K 3/4655; H05K 1/0306;
(Continued)

(56) References Cited

U.S. PATENT DOCUMENTS 5,065,285 A * 11/1991 Nagai .................. H05K 3/4626
361/792
2009/0273073 A1* 11/2009 Tachibana ......... H01L 23/49816
257/692
(Continued)

FOREIGN PATENT DOCUMENTS

CN       101542719 A    9/2009
JP       2007-329441    12/2007
(Continued)

OTHER PUBLICATIONS

International Search Report of PCT application No. PCT/JP2017/029840 dated Oct. 17, 2017.
(Continued)

*Primary Examiner* — Yuriy Semenenko
(74) *Attorney, Agent, or Firm* — McDermott Will & Emery LLP

(57) ABSTRACT

A printed wiring board includes: an inner insulating layer including a conductive wire; a first outermost insulating layer disposed on a first surface of the inner insulating layer; and a second outermost insulating layer disposed on a second surface of the inner insulating layer. A bending elastic modulus of each of the first outermost insulating layer and the second outermost insulating layer ranges from ¼ to ¾, inclusive, of a bending elastic modulus of the inner insulating layer. A glass transition temperature of each of the first outermost insulating layer and the second outer-
(Continued)

most insulating layer falls within ±20° C. of a glass transition temperature of the inner insulating layer.

8 Claims, 5 Drawing Sheets

(51) Int. Cl.
*H01L 23/15* (2006.01)
*H05K 1/03* (2006.01)
*H05K 1/02* (2006.01)

(52) U.S. Cl.
CPC ......... *H05K 1/0306* (2013.01); *H05K 3/4626* (2013.01); *H05K 3/4655* (2013.01); *H05K 1/0271* (2013.01); *H05K 1/0366* (2013.01); *H05K 1/0373* (2013.01); *H05K 2201/068* (2013.01)

(58) Field of Classification Search
CPC ........... H05K 3/4626; H05K 2201/068; H05K 1/0373; H05K 1/0271; H05K 1/0366
See application file for complete search history.

(56) References Cited

U.S. PATENT DOCUMENTS

| | | | |
|---|---|---|---|
| 2010/0032826 A1 | 2/2010 | Tachibana et al. | |
| 2012/0276392 A1* | 11/2012 | Takahashi | C08J 5/24 428/418 |
| 2015/0271923 A1* | 9/2015 | Shimabe | H05K 3/4602 174/251 |
| 2015/0282302 A1* | 10/2015 | Hoshi | B32B 15/20 174/258 |
| 2019/0292386 A1* | 9/2019 | Meura | C08K 3/22 |
| 2020/0199329 A1* | 6/2020 | Hu | C08F 220/14 |
| 2021/0013573 A1* | 1/2021 | Aoki | H01P 3/088 |

FOREIGN PATENT DOCUMENTS

| | | |
|---|---|---|
| JP | 2009-190387 A | 8/2009 |
| JP | 2015-189834 | 11/2015 |
| KR | 10-2009-092786 A | 9/2009 |
| WO | 2008/069343 | 6/2008 |
| WO | 2008/126817 | 10/2008 |

OTHER PUBLICATIONS

Extended European Search Report dated Sep. 4, 2019 for the related European Patent Application No. 17848556.1.
English Translation of Chinese Office Action dated Jun. 2, 2021 for the related Chinese Patent Application No. 201780052827.9.

* cited by examiner

PRINTED WIRING BOARD, PRINTED CIRCUIT BOARD, PREPREG

CROSS-REFERENCE TO RELATED APPLICATIONS

This application is a U.S. national stage application of the PCT International Application No. PCT/JP2017/029840 filed on Aug. 22, 2017, which claims the benefit of foreign priority of Japanese patent application 2016-173823 filed on Sep. 6, 2016, the contents all of which are incorporated herein by reference.

TECHNICAL FIELD

The present disclosure relates to a printed wiring board, a printed circuit board, and a prepreg.

BACKGROUND

Recently, necessity for enhancing wiring density of the printed wiring board and component mounting density is increasing in order to achieve miniaturization and high functionalization of an electronic device. There is a demand to improve mounting reliability as a number of components mounted on the printed wiring board. Conventionally a composite board, which includes a core board and an insulating layer having an elastic modulus smaller than that of the core board, has been developed in order to respond to the demand (for example, see Unexamined Japanese Patent Publication No. 2007-329441). In the composite board described in Unexamined Japanese Patent Publication No. 2007-329441, distortion stress caused by a difference in coefficient of thermal expansion can be absorbed by the insulating layer having the small elastic modulus, so that connection reliability is improved in the case that a mounting component is mounted on the composite board.

SUMMARY

According to one aspect of the present disclosure, a printed wiring board includes: an inner insulating layer including a conductive wire; a first outermost insulating layer; and a second outermost insulating layer. The first outermost insulating layer is disposed on a first surface of the inner insulating layer. The second outermost insulating layer is disposed on a second surface of the inner insulating layer. A bending elastic modulus of each of the first outermost insulating layer and the second outermost insulating layer ranges from $1/4$ to $3/4$, inclusive, of a bending elastic modulus of the inner insulating layer. A glass transition temperature of each of the first outermost insulating layer and the second outermost insulating layer falls within ±20° C. of a glass transition temperature of the inner insulating layer.

According to another aspect of the present disclosure, a printed circuit board includes the printed wiring board, an outermost conductive wire, and an electronic component. The outermost conductive wire is disposed on an outside surface of at least one of the first outermost insulating layer and the second outermost insulating layer. The electronic component is mounted so as to electrically connect to the outermost conductive wire.

According to still another aspect of the present disclosure, a prepreg is used as a material for a printed wiring board that includes: an inner insulating layer including a conductive wire; a first outermost insulating layer; and a second outermost insulating layer. The first outermost insulating layer is disposed on a first surface of the inner insulating layer. The second outermost insulating layer is disposed on a second surface of the inner insulating layer. A cured product of the prepreg constitutes each of the first outermost insulating layer and the second outermost insulating layer. And a bending elastic modulus of each of the first outermost insulating layer and the second outermost insulating layer ranges from $1/4$ to $3/4$, inclusive, of a bending elastic modulus of the inner insulating layer. A glass transition temperature of each of the first outermost insulating layer and the second outermost insulating layer falls within ±20° C. of a glass transition temperature of the inner insulating layer.

The present disclosure can improve the mounting reliability.

DESCRIPTION OF EMBODIMENT

Prior to description of an exemplary embodiment of the present disclosure, problems found in conventional techniques will briefly be described. The inventors found the following fact. That is, in the composite board described in Unexamined Japanese Patent Publication No. 2007-329441, when the composite board is heated, a warp is generated, the stress caused by the warp is concentrated on solder of a connecting portion between the composite board and the mounting component, and a crack is occasionally generated. In order to prevent the generation of the crack, it is insufficient to make the elastic modulus of the insulating layer smaller than the elastic modulus of the core board.

The present disclosure provides a printed wiring board, a printed circuit board, and a prepreg for being able to improve the mounting reliability.

An exemplary embodiment of the present disclosure will be described below.

[Printed Wiring Board]

Figure 1:
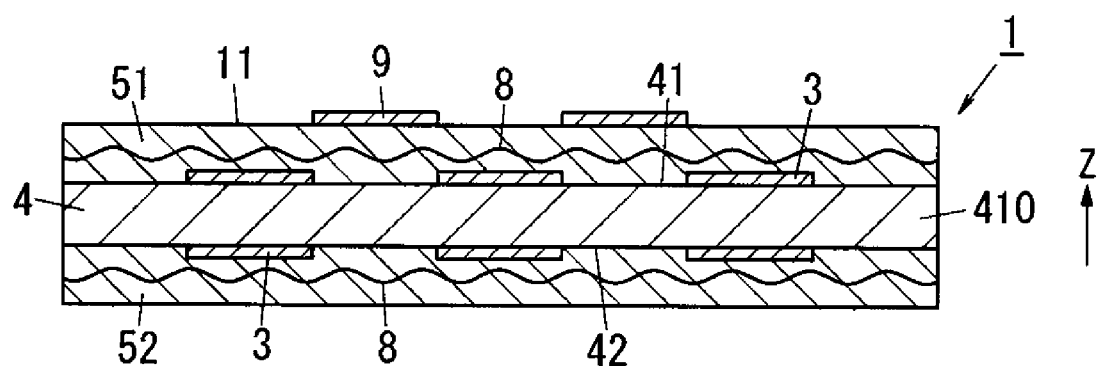
FIG. 1 is a schematic sectional view illustrating a printed wiring board according to an exemplary embodiment of the present disclosure.
Figure 2:
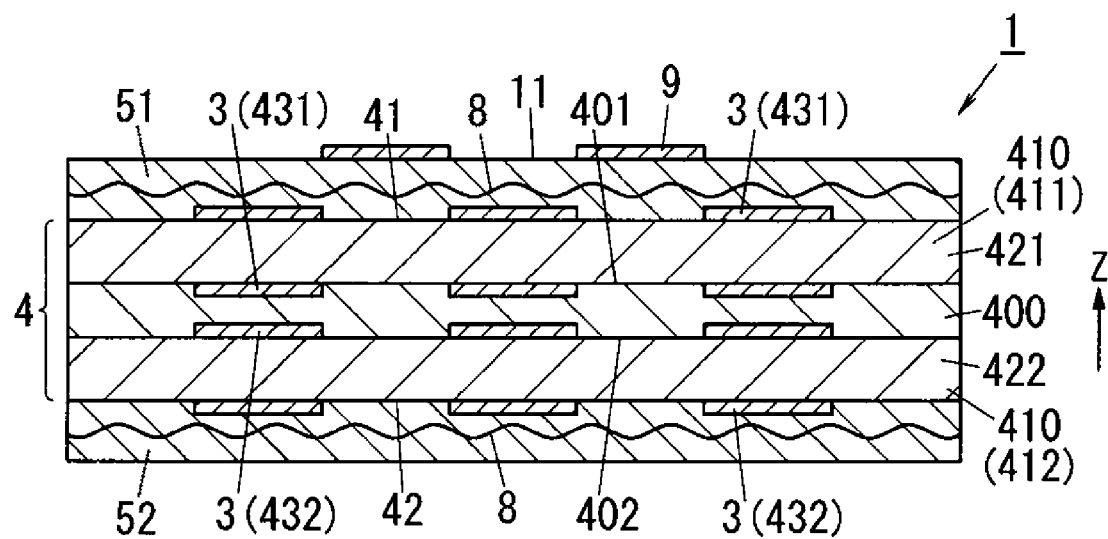
FIG. 2 is a schematic sectional view illustrating a printed wiring board according to another exemplary embodiment of the present disclosure.

As illustrated in FIGS. 1 and 2, printed wiring board 1 according to the exemplary embodiment includes inner insulating layer 4, first outermost insulating layer 51, and second outermost insulating layer 52. Inner insulating layer 4, first outermost insulating layer 51, and second outermost insulating layer 52 will be described. And next, relationships of a bending elastic modulus, a glass transition temperature (Tg), and a coefficient of thermal expansion for inner insulating layer 4, first outermost insulating layer 51, and second outermost insulating layer 52 will be described. In the following description, a thickness direction means a direction (Z-direction) parallel to a normal line to a plane (XY-plane). The plane (XY-plane) is parallel to a surface on which electronic component 10 is mounted in printed circuit board 2 as illustrated in FIG. 5B. Printed circuit board 2 is printed wiring board 1 on which electronic component 10 is mounted.

(Inner Insulating Layer)

Inner insulating layer 4 is a core member that is inserted in printed wiring board 1 as a core, and inner insulating layer 4 has insulating property. Inner insulating layer 4 includes first surface 41 and second surface 42, and first surface 41 and second surface 42 are surfaces that have a front-rear relation. Conductive wire 3 is formed on at least one of first surface 41 and second surface 42. That is, inner insulating layer 4 includes conductive wire 3. Conductive wire 3 constitutes a conductive layer in an inner layer of printed wiring board 1. Specific examples of the conductive layer of the inner layer include a signal layer, a power supply layer, and a ground layer.

Inner insulating layer 4 may be constructed with single inner layer member 410 as illustrated in FIG. 1, or constructed with a plurality of inner layer members 410 as illustrated in FIG. 2.

The case that inner insulating layer 4 is constructed with single inner layer member 410 as illustrated in FIG. 1 will be described. In this case, inner insulating layer 4 including conductive wire 3 can be manufactured by applying a subtractive method to an insulating board, such as a metal-clad laminate, in which metal foil exists on a surface. A copper-clad laminate can be cited as a specific example of the metal-clad laminate. Inner insulating layer 4 including conductive wire 3 may be manufactured by applying an additive method to an insulating board, such as an unclad board, in which the metal foil does not exist on the surface.

The case that inner insulating layer 4 is constructed with the plurality of inner layer members 410 as illustrated in FIG. 2 will be described. The case that inner insulating layer 4 is constructed with two inner layer members 410 will be described below. However, the number of inner layer members 410 is not particularly limited. Inner insulating layer 4 includes adhesive layer 400, first inner layer member 411, and second inner layer member 412. Adhesive layer 400, first inner layer member 411, and second inner layer member 412 will be described below.

<Adhesive Layer>

Adhesive layer 400 is a layer that is interposed between first inner layer member 411 and second inner layer member 412 so as to bond first inner layer member 411 and second inner layer member 412 together. Adhesive layer 400 has insulating property. Any material can be used as adhesive layer 400 as long as the material has the adhesive property and the insulating property. A thickness of adhesive layer 400 is not particularly limited as long as the insulating property can be secured between first inner layer member 411 and second inner layer member 412. Adhesive layer 400 includes first surface 401 and second surface 402, and first surface 401 and second surface 402 are surfaces have the front-rear relation. For example, adhesive layer 400 can be constructed with an adhesive sheet 440 (see FIG. 4A) having a thermosetting property.

<First Inner Layer Member and Second Inner Layer Member>

First inner layer member 411 is formed on first surface 401 of adhesive layer 400. First inner layer member 411 includes first substrate 421 and first conductive wire 431. First inner layer member 411 can be manufactured as follows. That is, first inner layer member 411 including first conductive wire 431 can be manufactured by applying the subtractive method to first substrate 421, such as a metal-clad laminate, in which the metal foil exists on the surface. A copper-clad laminate can be cited as a specific example of the metal-clad laminate. First inner layer member 411 including first conductive wire 431 may be manufactured by applying the additive method to first substrate 421, such as an unclad board, in which the metal foil does not exist on the surface. First conductive wire 431 is formed in the surface of first substrate 421. First conductive wire 431 may be formed in both surfaces or one surface of first substrate 421.

Second inner layer member 412 is formed on second surface 402 of adhesive layer 400. Second inner layer member 412 includes second substrate 422 and second conductive wire 432. Second inner layer member 412 can be manufactured similarly to first inner layer member 411. Second conductive wire 432 is formed in the surface of second substrate 422. Second conductive wire 432 may be formed in both the surfaces or single surface of second substrate 422.

In the thickness direction (Z-direction) of inner insulating layer 4, first inner layer member 411 and second inner layer member 412 are preferably symmetrical with respect to adhesive layer 400. Specifically, first substrate 421 and second substrate 422 preferably have an identical thickness. First substrate 421 and second substrate 422 are preferably made of an identical material. Consequently, the generation of the warp of the printed wiring board 1 and printed circuit board 2 can be prevented, and thus the mounting reliability can further be improved.

(First Outermost Insulating Layer and Second Outermost Insulating Layer)

First outermost insulating layer 51 is formed on first surface 41 of inner insulating layer 4. Second outermost insulating layer 52 is formed on second surface 42 of inner insulating layer 4. First outermost insulating layer 51 and second outermost insulating layer 52 preferably have an identical thickness. First outermost insulating layer 51 and second outermost insulating layer 52 are preferably made of an identical material. Consequently, the symmetry is established with respect to inner insulating layer 4 in the thickness direction (Z-direction) of printed wiring board 1 and printed circuit board 2, so that the generation of the warp of the printed wiring board 1 and printed circuit board 2 can be prevented, and thus the mounting reliability can further be improved. As described above, since conductive wire 3 is formed on at least one of first surface 41 and second surface 42, in a strict meaning, the whole surface of first surface 41 does not occasionally contact with first outermost insulating layer 51, and the whole surface of second surface 42 does not occasionally contact with second outermost insulating layer 52.

Figure 3A:
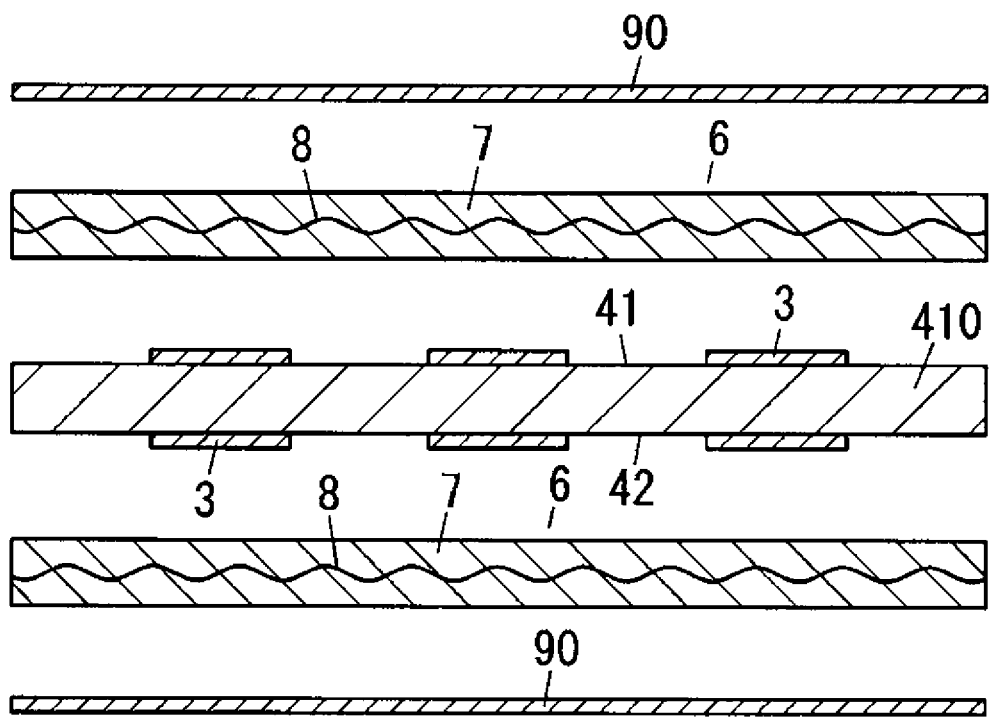
FIG. 3A is a schematic sectional view illustrating a process of manufacturing the printed wiring board in FIG. 1.
Figure 4A:
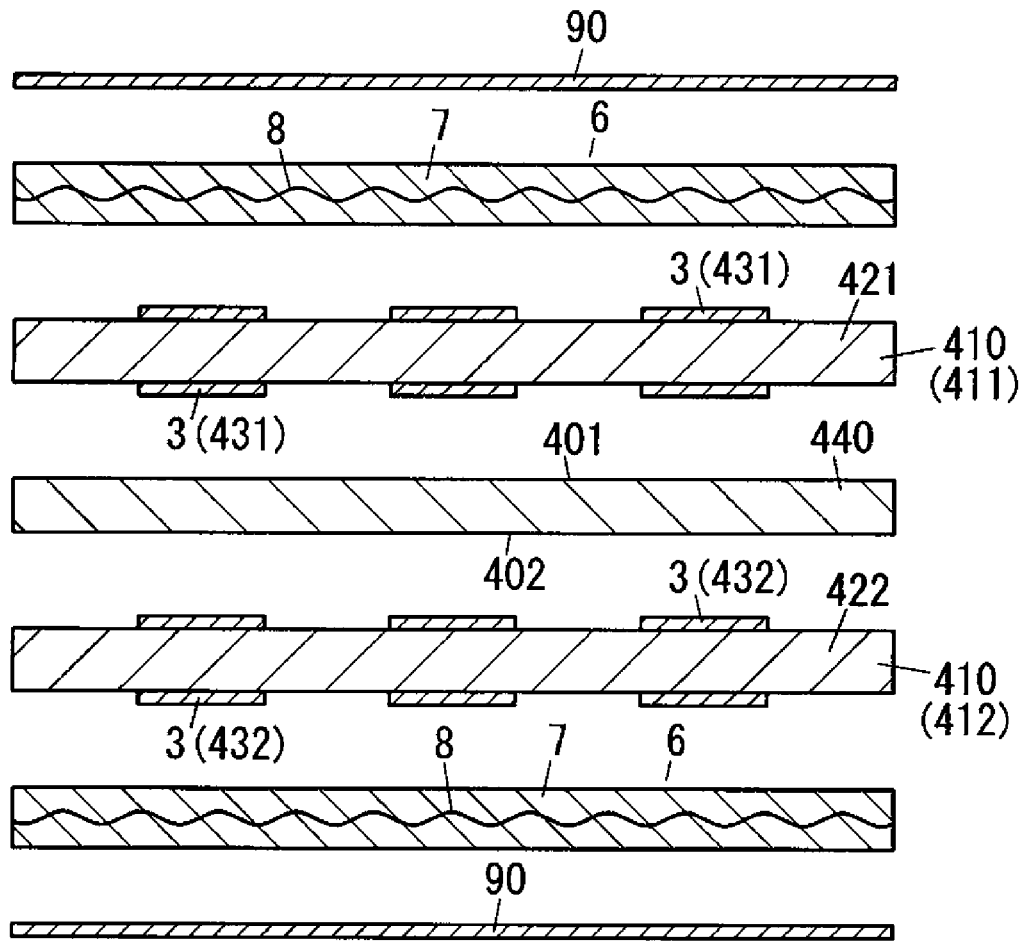
FIG. 4A is a schematic sectional view illustrating a process of manufacturing the printed wiring board in FIG. 2.

First outermost insulating layer 51 and second outermost insulating layer 52 are preferably constructed with a cured product of prepreg 6 (see FIGS. 3A and 4A). Prepreg 6 will be described below.

<Prepreg>

As illustrated in FIGS. 3A and 4A, prepreg 6 includes thermosetting resin composition 7, and base material 8.

Thermosetting resin composition 7 preferably contains an epoxy resin, a curing agent, a curing accelerator, an inorganic filler, and an elasticity lowering agent.

A brominated epoxy resin and a cresol-novolak type epoxy resin can be cited as a specific example of the epoxy resin.

A novolak type phenolic resin and dicyandiamide can be cited as a specific example of the curing agent. In the case that the novolak type phenolic resin is used as the curing agent, the novolak type phenolic resin ranges preferably from 0.8 equivalents to 1.1 equivalents, inclusive, with respect to 1 equivalent of the epoxy resin. In the case that dicyandiamide is used as the curing agent, dicyandiamide ranges preferably from 0.3 equivalents to 0.6 equivalents, inclusive, with respect to 1 equivalent of the epoxy resin.

2-ethyl-4-methylimidazole can be cites as a specific example of the curing accelerator. Assuming that phr is an adding content (parts by mass) of the curing accelerator with respect to 100 parts by mass of the epoxy resin, the adding content of the curing accelerator ranges preferably from 0.01 phr to 3 phr, inclusive.

Specific examples of the inorganic filler include aluminum hydroxide, spherical silica, crushed silica, and crushed glass.

Specific examples of the elasticity lowering agent include ethylene-acrylic rubber including carboxyl group, nitrile rubber including carboxyl group, core-shell type rubber, acrylic rubber powers, and silicone powders. Among others, ethylene-acrylic rubber including carboxyl group is preferably used. Core-shell type rubber is a pearl-like fine particle having a core-shell structure in which a core layer made of a rubber-like polymer is coated with a shell layer made of a glassy polymer.

Ethylene-acrylic rubber including carboxyl group provides a characteristic different from that of general rubber to printed wiring board 1 and printed circuit board 2. In general rubber, although the elastic moduli of printed wiring board 1 and printed circuit board 2 can be lowered, there is a risk that the coefficient of thermal expansion rises or the glass transition temperature drops. Due to the rise of the coefficient of thermal expansion and the drop of the glass transition temperature, there is a risk of generating the warp in printed wiring board 1 and printed circuit board 2. In this case, when printed wiring board 1 and printed circuit board 2 have high elasticity, stress generated in solder connecting unit 12 (see FIGS. 5A and 5B) increases to cause a risk of generating a solder crack. For this reason, printed wiring board 1 and printed circuit board 2 preferably have low elasticity. In contrast to general rubber, in ethylene-acrylic rubber including carboxyl group, the elastic modulus can be lowered while the rises of the coefficients of thermal expansion of printed wiring board 1 and printed circuit board 2 and the drop of the glass transition temperature are prevented. Consequently, the generation of the warp of the printed wiring board 1 and printed circuit board 2 can be prevented, and a heat resisting property can also be enhanced. The stress generated in solder connecting unit 12 that electrically and physically connects electronic component 10 and printed wiring board 1 can easily be relaxed, and the mounting reliability can further be improved.

A content of the inorganic filler ranges preferably from 50 parts by mass to 200 parts by mass, inclusive, with respect to 100 parts by mass of epoxy resin. When the content of the inorganic filler is greater than or equal to 50 parts by mass, the rises of the coefficients of thermal expansion of printed wiring board 1 and printed circuit board 2 can be prevented. In particular, rise of a coefficient of thermal expansion in a direction perpendicular to the thickness direction (Z-direction) of printed wiring board 1 and printed circuit board 2 can be prevented. Specifically, as illustrated in FIG. 5B, the rise of the coefficient of thermal expansion in a direction parallel to the XY-plane can be prevented in mounting surface 11. When the content of the inorganic filler is less than or equal to 200 parts by mass, the rise of the elastic modulus can be prevented. Consequently, the stress generated in solder connecting unit 12 that electrically and physically connects electronic component 10 and printed wiring board 1 can easily be relaxed, and the mounting reliability can further be improved.

A content of the elasticity lowering agent ranges preferably from 5 parts by mass to 70 parts by mass, inclusive, with respect to 100 parts by mass of epoxy resin. When the content of the elasticity lowering agent is greater than or equal to 5 parts by mass, the effect by adding the elasticity lowering agent can further be exhibited. When the content of the elasticity lowering agent is less than or equal to 70 parts by mass, degradation in adhesion between each of first outermost insulating layer 51 and second outermost insulating layer 52 and each of conductive wire 3 and outermost conductive wire 9 can be prevented. Degradation in moldability (circuit embedding property) of thermosetting resin composition 7 can also be prevented. That is, in manufacturing printed wiring board 1, thermosetting resin composition 7 can be embedded in a gap between adjacent conductive wires 3, 3 in each of first surface 41 and second surface 42 while preventing generation of a void (bubble) in the gap.

Thermosetting resin composition 7 may contain a softening material. Alkylacetalized polyvinylalcohol can be cited as a specific example of the softening material.

Thermosetting resin composition 7 can be prepared by mixing the epoxy resin, the curing agent, the curing accelerator, the inorganic filler, and the elasticity lowering agent, and by further mixing the softening material as needed.

Although base material 8 is, for example, woven fabric or non-woven textile fabric made of inorganic fiber or woven fabric or non-woven textile fabric made of organic fiber, base material 8 is not particularly limited. Glass cloth can be cited as a specific example of the woven fabric made of the inorganic fiber.

In manufacturing prepreg 6, at first base material 8 is impregnated with thermosetting resin composition 7. In order to impregnate base material 8 with thermosetting resin composition 7, thermosetting resin composition 7 may be diluted with a solvent to form varnish. N,N-dimethylformamide and methyl ethyl ketone can be cited as a specific example of the solvent. As described above, base material 8 is impregnated with thermosetting resin composition 7. Thermosetting resin composition 7 is put into a semi-cured state by heating base material 8 impregnated with thermosetting resin composition 7. The semi-cured state is a state of a B stage, and the B stage is an intermediate stage of a curing reaction. The intermediate stage is a state between an A stage in a varnish state having fluidity and a C stage in a completely cured state. In prepreg 6, thermosetting resin composition 7 is in a semi-cured state. When prepreg 6 is heated, after thermosetting resin composition 7 in the semi-cured state is melted once, thermosetting resin composition 7 is completely cured to enter the C stage.

(Bending Elastic Modulus)

The bending elastic modulus of each of first outermost insulating layer 51 and second outermost insulating layer 52 ranges from ¼ to ¾, inclusive, of a bending elastic modulus of inner insulating layer 4. As described above, first outermost insulating layer 51 and second outermost insulating layer 52 have lower elasticity as compared with inner insulating layer 4. When the bending elastic modulus of each of first outermost insulating layer 51 and second outermost insulating layer 52 is less than 1/4 of the bending elastic modulus of inner insulating layer 4, outermost conductive wire 9 is hardly formed on the outside surface of each of first outermost insulating layer 51 and second outermost insulating layer 52. Hence, the adhesion of outermost conductive wire 9 is degraded, and there is a risk that mounting surface 11 is sunken in mounting electronic component 10. When the bending elastic modulus of each of first outermost insulating layer 51 and second outermost insulating layer 52 is greater than 3/4 of the bending elastic modulus of inner insulating layer 4, the stress generated in solder connecting unit 12 that electrically and physically connects electronic component 10 and printed wiring board 1 is hardly absorbed. Hence, there is a risk of degrading the mounting reliability. The bending elastic modulus of inner insulating layer 4 ranges preferably from 15 GPa to 35 GPa, inclusive.

At this point, although the bending elastic modulus of first outermost insulating layer 51 may be different from the bending elastic modulus of second outermost insulating layer 52, the bending elastic modulus of first outermost insulating layer 51 is preferably identical to the bending elastic modulus of second outermost insulating layer 52. When the bending elastic modulus of first outermost insulating layer 51 is identical to the bending elastic modulus of second outermost insulating layer 52, the symmetry is established with respect to inner insulating layer 4 in the thickness direction (Z-direction) of printed wiring board 1 and printed circuit board 2. Hence, generation of the warp of the printed wiring board 1 and printed circuit board 2 can be prevented, and the mounting reliability can further be improved.

A method for measuring the bending elastic moduli of inner insulating layer 4, first outermost insulating layer 51, and second outermost insulating layer 52 will be described below. A first method is measuring the bending elastic modulus of each of inner insulating layer 4, first outermost insulating layer 51, and second outermost insulating layer 52 after breaking down manufactured printed wiring board 1 or printed circuit board 2 into inner insulating layer 4, first outermost insulating layer 51, and second outermost insulating layer 52. A second method is individually manufacturing inner insulating layer 4, first outermost insulating layer 51, and second outermost insulating layer 52 for printed wiring board 1 or printed circuit board 2 to be manufactured, and then measuring the bending elastic modulus of each of inner insulating layer 4, first outermost insulating layer 51, and second outermost insulating layer 52. In both the methods, the bending elastic modulus can be measured according to JIS K 7171.

(Glass Transition Temperature)

A glass transition temperature of each of first outermost insulating layer 51 and second outermost insulating layer 52 falls within ±20° C. of a glass transition temperature of inner insulating layer 4. That is, it means that (the glass transition temperature of inner insulating layer 4−20° C.)≤(the glass transition temperature of each of first outermost insulating layer 51 and second outermost insulating layer 52)≤(the glass transition temperature of inner insulating layer 4+20° C.). Unless the condition of this inequality is satisfied, the material having the lower glass transition temperature is previously softened by heating due to reflow soldering in mounting electronic component 10. Hence, there is a risk that the stress involved in printed wiring board 1 is released to generate the warp. In this case, since the stress due to the warp may not be absorbed only by stress absorbing effects of first outermost insulating layer 51 and second outermost insulating layer 52, there is a risk of generating a solder crack in solder connecting unit 12 that electrically and physically connects electronic component 10 and printed wiring board 1. Preferably the glass transition temperature of the inner insulating layer 4 is greater than or equal to 130° C.

At this point, although the glass transition temperature of first outermost insulating layer 51 may be different from the glass transition temperature of second outermost insulating layer 52, the glass transition temperature of first outermost insulating layer 51 is preferably identical to the glass transition temperature of second outermost insulating layer 52. When the glass transition temperature of first outermost insulating layer 51 is identical to the glass transition temperature of second outermost insulating layer 52, the symmetry is established with respect to inner insulating layer 4 in the thickness direction (Z-direction) of printed wiring board 1 and printed circuit board 2. Hence, generation of the warp of the printed wiring board 1 and printed circuit board 2 can be prevented, and the mounting reliability can further be improved.

A method for measuring the glass transition temperatures of inner insulating layer 4, first outermost insulating layer 51, and second outermost insulating layer 52 will be described below. A first method is measuring the glass transition temperature of each of inner insulating layer 4, first outermost insulating layer 51, and second outermost insulating layer 52 after breaking down manufactured printed wiring board 1 or printed circuit board 2 into inner insulating layer 4, first outermost insulating layer 51, and second outermost insulating layer 52. A second method is individually manufacturing inner insulating layer 4, first outermost insulating layer 51, and second outermost insulating layer 52 for printed wiring board 1 or printed circuit board 2 to be manufactured, and then measuring the glass transition temperature of each of inner insulating layer 4, first outermost insulating layer 51, and second outermost insulating layer 52. In both the methods, the glass transition temperature can be measured according to JIS K 7197.

(Coefficient of Thermal Expansion)

A coefficient of thermal expansion in a direction perpendicular to the thickness direction of each of first outermost insulating layer 51 and second outermost insulating layer 52 falls within ±30% of a coefficient of thermal expansion in a direction perpendicular to the thickness direction of inner insulating layer 4. Hereinafter, unless otherwise noted, the coefficient of thermal expansion in a direction perpendicular to the thickness direction is simply referred to as a coefficient of thermal expansion. That is, it means that (the coefficient of thermal expansion of inner insulating layer 4×0.7)≤(the coefficient of thermal expansion of each of first outermost insulating layer 51 and second outermost insulating layer 52)≤(the coefficient of thermal expansion of inner insulating layer 4×1.3). In other words, the coefficient of thermal expansion in a direction perpendicular to the thickness direction means the coefficient of thermal expansion in a direction in the XY-plane in FIG. 5B. When the condition of this inequality is satisfied, generation of the warp like bimetal by heating due to the reflow soldering in mounting electronic component 10 can be prevented. Even if the warp is slightly generated, when the stress due to the warp is small, the stress can be absorbed by the stress absorbing effects of first outermost insulating layer 51 and second outermost insulating layer 52. Hence, generation of the solder crack can be prevented in solder connecting unit 12 that electrically and physically connects electronic component 10 and printed wiring board 1. The coefficient of thermal expansion of inner insulating layer 4 ranges preferably from 5 ppm/° C. to 15 ppm/° C., inclusive.

At this point, although the coefficient of thermal expansion of first outermost insulating layer 51 may be different from the coefficient of thermal expansion of second outermost insulating layer 52, the coefficient of thermal expansion of first outermost insulating layer 51 is preferably identical to the coefficient of thermal expansion of second outermost insulating layer 52. When the coefficient of thermal expansion of first outermost insulating layer 51 is identical to the coefficient of thermal expansion of second outermost insulating layer 52, the symmetry is established with respect to inner insulating layer 4 in the thickness direction (Z-direction) of printed wiring board 1 and printed circuit board 2. Hence, generation of the warp of the printed wiring board 1 and printed circuit board 2 can be prevented, the mounting reliability can further be improved.

A method for measuring the coefficients of thermal expansion of inner insulating layer 4, first outermost insulating layer 51, and second outermost insulating layer 52 will be described below. A first method is measuring the coefficient of thermal expansion of each of inner insulating layer 4, first outermost insulating layer 51, and second outermost insulating layer 52 after breaking down manufactured printed wiring board 1 or printed circuit board 2 into inner insulating layer 4, first outermost insulating layer 51, and second outermost insulating layer 52. A second method is individually manufacturing inner insulating layer 4, first outermost insulating layer 51, and second outermost insulating layer 52 for printed wiring board 1 or printed circuit board 2 to be manufactured, and then measuring the coefficient of thermal expansion of each of inner insulating layer 4, first outermost insulating layer 51, and second outermost insulating layer 52. In both the methods, the coefficient of thermal expansion can be measured according to JIS K 7197.

[Printed Wiring Board Manufacturing Method]

An example of a method for manufacturing printed wiring board 1 of the present exemplary embodiment will be described.

Figure 3B:
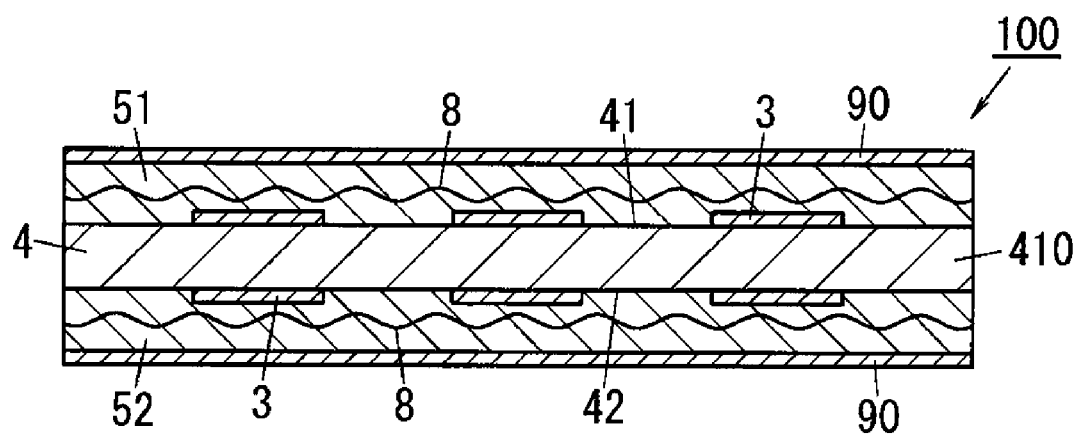
FIG. 3B is a schematic sectional view illustrating the process of manufacturing the printed wiring board in FIG. 1.

A method for forming inner insulating layer 4 using single inner layer member 410 to manufacture printed wiring board 1 will be described with reference to FIGS. 3A and 3B. As illustrated in FIG. 3A, prepreg 6 is overlapped on first surface 41 and second surface 42 of inner layer member 410, and metal foil 90 is overlapped on the outside of prepreg 6. Metal-clad laminate 100 in FIG. 3B is obtained by heating and pressurization in this state. After thermosetting resin composition 7 in the semi-cured state of prepreg 6 is melted once by heating and pressurization, thermosetting resin composition 7 is completely cured to enter the C stage. Inner layer member 410 constitutes inner insulating layer 4, prepreg 6 contacting with first surface 41 of inner insulating layer 4 constitutes first outermost insulating layer 51, and prepreg 6 contacting with second surface 42 of inner insulating layer 4 constitutes second outermost insulating layer 52. Subsequently, an unnecessary portion of metal foil 90 bonded to each of first outermost insulating layer 51 and second outermost insulating layer 52 is removed by etching or the like to form outermost conductive wire 9, thereby obtaining printed wiring board 1 in FIG. 1.

Figure 4B:
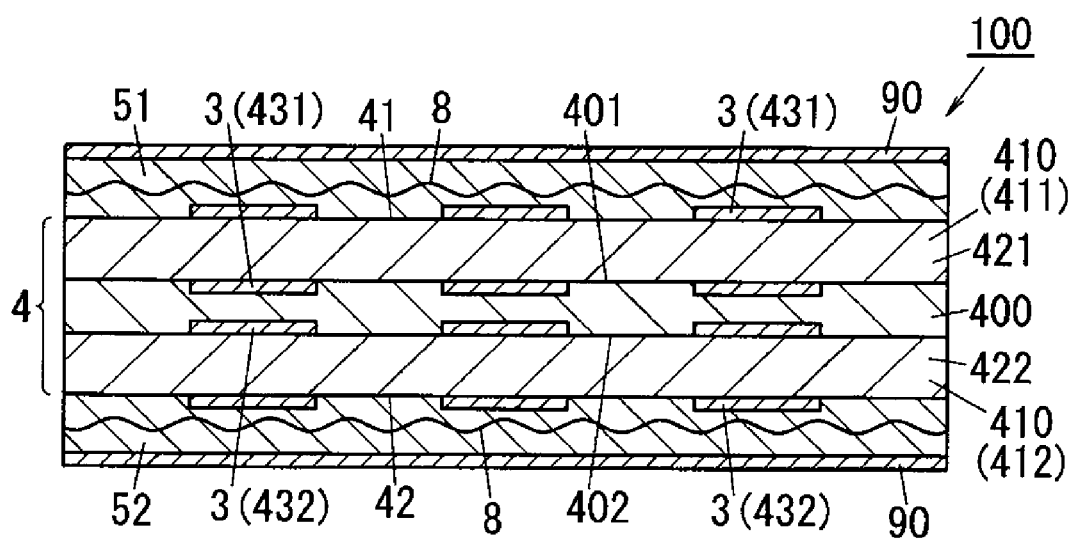
FIG. 4B is a schematic sectional view illustrating a process of manufacturing the printed wiring board in FIG. 2.

A method for forming inner insulating layer 4 using the plurality of inner layer members 410 to manufacture printed wiring board 1 will be described with reference to FIGS. 4A and 4B. As illustrated in FIG. 4A, first inner layer member 411, prepreg 6, and metal foil 90 are overlapped on first surface 401 of adhesive sheet 440 in this order, and second inner layer member 412, prepreg 6, and metal foil 90 are overlapped on second surface 402 of adhesive sheet 440 in this order. Metal-clad laminate 100 in FIG. 4B is obtained by heating and pressurization in this state. After thermosetting resin composition 7 and adhesive sheet 440 in the semi-cured state of prepreg 6 are melted once by heating and pressurization, thermosetting resin composition 7 and adhesive sheet 440 are completely cured to becomes the C stage. Adhesive sheet 440 constitutes adhesive layer 400, and is integrated with first inner layer member 411 and second inner layer member 412 to constitute inner insulating layer 4. Further prepreg 6 contacting with first inner layer member 411 constitutes first outermost insulating layer 51, and prepreg 6 contacting with second inner layer member 412 constitutes second outermost insulating layer 52. Subsequently, an unnecessary portion of metal foil 90 bonded to each of first outermost insulating layer 51 and second outermost insulating layer 52 is removed by etching or the like to form outermost conductive wire 9, thereby obtaining printed wiring board 1 in FIG. 2.

In printed wiring board 1, the number of conductive layers is not particularly limited, but an upper limit of the number of conductive layers is about 20 layers. In the case that the number of conductive layers is increased, inner insulating layer 4 may be formed by alternately overlapping adhesive sheets 440 and inner layer members 410 on each other until the required number is satisfied.

[Printed Circuit Board]

Figure 5A:
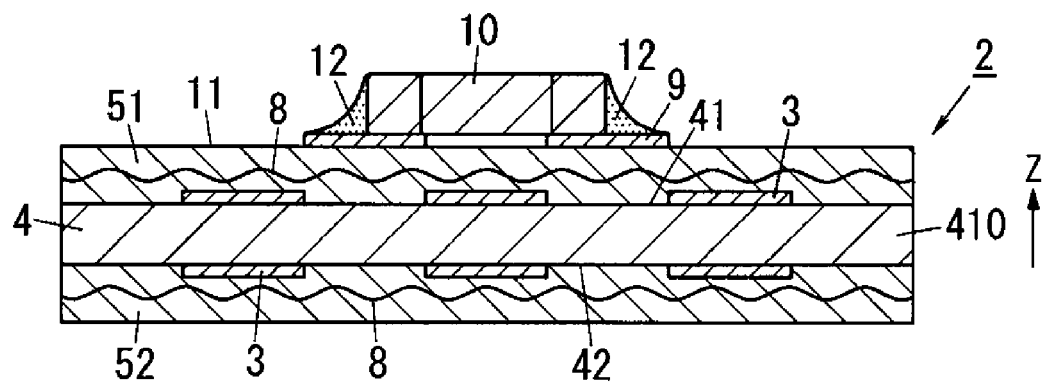
FIG. 5A is a schematic sectional view illustrating a printed circuit board according to an exemplary embodiment of the present disclosure.
Figure 5B:
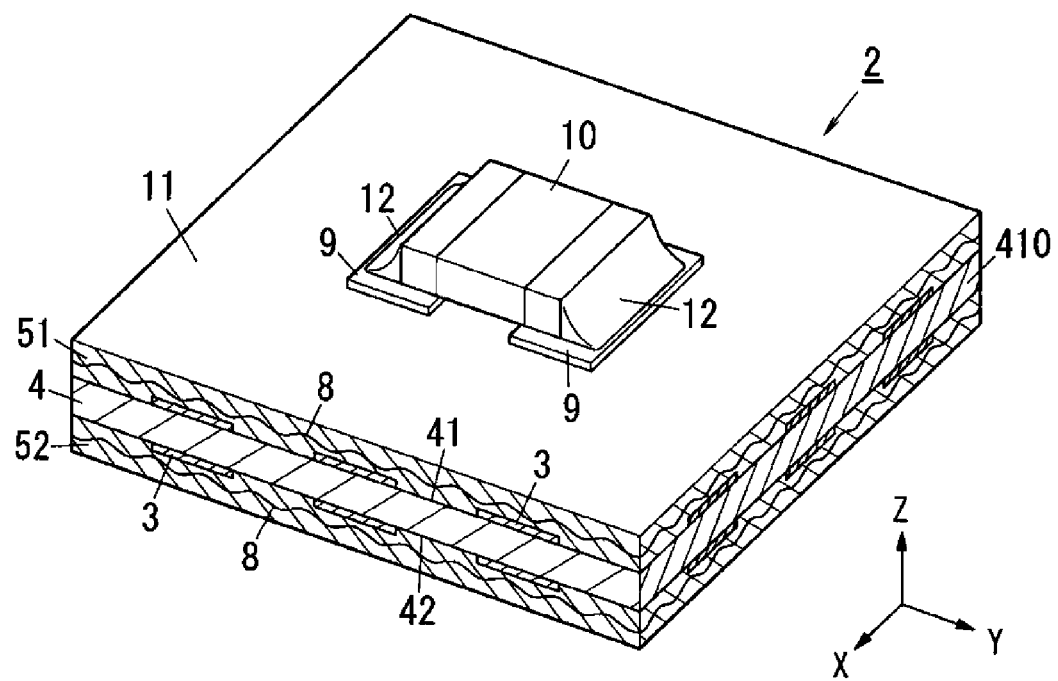
FIG. 5B is a schematic perspective view illustrating the printed circuit board of the exemplary embodiment of the present disclosure.
Figure 6:
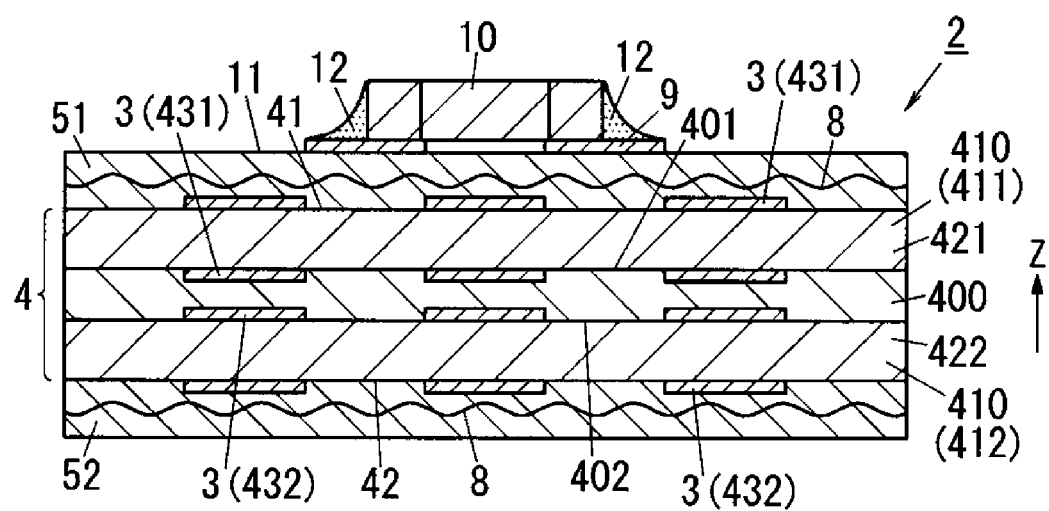
FIG. 6 is a schematic sectional view illustrating a printed circuit board according to another exemplary embodiment of the present disclosure.

As illustrated in FIGS. 5A, 5B, and 6, printed circuit board 2 of the exemplary embodiment includes printed wiring board 1, outermost conductive wire 9, and electronic component 10.

(Printed Wiring Board)

For example, printed wiring board 1 is one shown in FIGS. 1 and 2. However, printed wiring board 1 is not limited to these configurations.

(Outermost Conductive Wire)

Outermost conductive wire 9 is formed on an outside surface of at least one of first outermost insulating layer 51 and second outermost insulating layer 52 of printed wiring board 1. The outside surface constitutes mounting surface 11. Outermost conductive wire 9 constitutes a conductive layer of an outer layer on an outside of outer layer printed wiring board 1. Specific examples of the conductive layer of the outer layer include a component mounting land, a signal layer, a power supply layer, and a ground layer.

(Electronic Component)

Electronic component 10 is, for example, a surface mount device (SMD). However, electronic component 10 is not limited to this configuration. 3216 (3.2 mm×1.6 mm), 2012 (2.0 mm×1.25 mm), and 1608 (1.6 mm×0.8 mm) can be cited as a specific example of electronic component 10. The coefficient of thermal expansion of electronic component 10 ranges preferably from 5 ppm/° C. to 9 ppm/° C., inclusive. As illustrated in FIGS. 5A, 5B, and 6, electronic component 10 is mounted while electrically connected to outermost conductive wire 9. Specifically, solder connecting unit 12 is formed between electronic component 10 and outermost conductive wire 9 of printed wiring board 1 by the reflow soldering. Thus, electronic component 10 and outermost conductive wire 9 of printed wiring board 1 are electrically and physically connected to each other.

As described above, the bending elastic modulus and the glass transition temperature (Tg) of each of inner insulating layer 4, first outermost insulating layer 51, and second outermost insulating layer 52 are defined, so that the mounting reliability can be improved in printed circuit board 2 of the exemplary embodiment.

Examples

The present disclosure will specifically be described below by Example.
[Thermosetting Resin Composition]
The following materials were used as a constituent of the thermosetting resin composition.
(Epoxy Resin)
  Brominated epoxy resin ("DER593" (product of The Dow Chemical Company)
  Cresol-novolak type epoxy resin ("N-690" (product of DIC CORPORATION))
  Brominated epoxy resin ("153" (product of DIC CORPORATION))
(Curing Agent)
  Novolak type phenolic resin ("TD-2090" (product of DIC CORPORATION))
(Curing Accelerator)
  2-ethyl-4-methyl imidazole ("2E4MZ" (produced by SHIKOKU CHEMICALS CORPORATION))
(Inorganic Filler)
  Aluminum hydroxide ("CL303M" (product of Sumitomo Chemical Co., Ltd.))
  Spherical silica ("SO-25R" (product of Admatechs)
(Elasticity Lowering Agent)
  Carboxyl group-containing ethylene-acrylic rubber ("Vamac G" (product of DuPont))
  Carboxyl group-containing nitrile rubber ("XER-32" (product of JSR Corporation))
  Core-shell type rubber ("AC-3816N" (product of Aica Kogyo Co., Ltd.))
  Acrylic rubber power ("SRK200" (product of SEKISUI CHEMICAL CO., LTD.))
  Silicone powder ("EP-2601" (product of DOW CORNING TORAY))
(Solvent)
  MEK (methyl ethyl ketone)
Varnishes 1 to 5 of the thermosetting resin composition were manufactured by mixing each constituent according to a formulation in Table 1.
[Prepreg]
Base materials ("7628 type cloth" (product of Nitto Boseki Co., Ltd.)) is heated after impregnated with the varnishes 1 to 5, and prepregs 1 to 5 having the thickness of 0.2 mm were manufactured. "R-1551" manufactured by Panasonic Corporation (a prepreg that is a material of "R-1566") and "R-1650D" manufactured by Panasonic Corporation (a prepreg that is a material of "R-1755D") were prepared as an already-made prepreg.
[Inner Layer Member]
Two kinds of inner layer members in which the conductive wire made of copper foil having the thickness of 35 μm was formed on the first surface and the second surface of the board having the thickness of 0.6 mm were prepared. Specifically, these inner layer members were obtained by processing "R-1566" and "R-1755D" (product of Panasonic Corporation).
[Printed Wiring Board]
The prepreg was overlapped on the first surface and the second surface of the inner layer member, and the copper foil having the thickness of 18 μm was overlapped on the outside of the prepreg. Using a vacuum press, the laminate was pressurized with 3 MPa for 90 minutes while heated at 180° C. under vacuum, thereby obtaining the metal-clad laminate. Subsequently, an unnecessary portion of the copper foil bonded to each of the first outermost insulating layer and the second outermost insulating layer was removed by etching or the like to form the outermost conductive wire, thereby obtaining the printed wiring board.
[Printed Circuit Board]
The printed circuit board was obtained by mounting electronic components having chip sizes 3216, 2012, 1608 on the printed wiring board.
[Bending Elastic Modulus]
The bending elastic modulus of each of the inner insulating layer, the first outermost insulating layer, and the second outermost insulating layer was measured. The bending elastic modulus of the inner insulating layer was obtained by measuring the bending elastic modulus of the inner layer member. The bending elastic modulus of each of the first outermost insulating layer and the second outermost insulating layer was obtained by measuring the bending elastic modulus of the cured product of the prepreg. The cured product of the prepreg was obtained by curing the prepreg under the condition identical to the heating and pressurization conditions in manufacturing the printed wiring board. The bending elastic modulus was measured according to JIS K 7171. Since only one kind of prepreg is used in manufacturing each printed wiring board, the bending elastic moduli of the first outermost insulating layer and second outermost insulating layer are identical to each other.
[Glass Transition Temperature]
The glass transition temperature of each of the inner insulating layer, the first outermost insulating layer, and the second outermost insulating layer was measured. The glass transition temperature of the inner insulating layer was obtained by measuring the glass transition temperature of the inner layer member. The glass transition temperature of each of the first outermost insulating layer and the second outermost insulating layer was obtained by measuring the glass transition temperature of the cured product of the prepreg. The cured product of the prepreg was obtained by curing the prepreg under the condition identical to the heating and pressurization conditions in manufacturing the printed wiring board. The glass transition temperature was measured according to JIS K 7197. Since only one kind of prepreg is used in manufacturing each printed wiring board, the glass transition temperatures of the first outermost insulating layer and second outermost insulating layer are identical to each other.
[Coefficient of Thermal Expansion]
The coefficient of thermal expansion of each of the inner insulating layer, the first outermost insulating layer, and the second outermost insulating layer was measured. The coefficient of thermal expansion of the inner insulating layer was obtained by measuring the coefficient of thermal expansion of the inner layer member. The coefficient of thermal expansion of each of the first outermost insulating layer and the second outermost insulating layer were obtained by measuring the coefficient of thermal expansion of the cured product of the prepreg. The cured product of the prepreg was obtained by curing the prepreg under the condition identical to the heating and pressurization conditions in manufacturing the printed wiring board. The coefficient of thermal expansion was measured according to JIS K 7197 using a vertical type thermomechanical analyzer (TMA). Since only one kind of prepreg is used in manufacturing each printed wiring board, the coefficients of thermal expansion of the first outermost insulating layer and second outermost insulating layer are identical to each other.

[Reflow Cycle Test]

A reflow cycle test was performed on the printed circuit board. Specifically, an operation of heating the printed circuit board in a reflow furnace according to a heating profile having a peak of 260° C. for lead-free solder was conducted as one cycle of operation, and the cycle was repeated 10 times. Subsequently, the state of the printed circuit board was observed. An observation result was evaluated based on the following determination criterion.

"OK": printed circuit board having no abnormal appearance

"NG": printed circuit board in which a swell due to interlayer peeling is generated

[Temperature Cycle Test]

A temperature cycle test was performed on the printed circuit board. Specifically, an operation of providing a load on the printed circuit board at −40° C. for 30 minutes and providing a load on the printed circuit board at 125° C. for 30 minutes was conducted as one cycle of operation, and the cycle was repeated 3000 times. Subsequently, a sectional state of the solder connecting unit of the printed circuit board was observed. The observation result was evaluated based on the following determination criterion.

"OK": printed circuit board in which a length of the crack is less than or equal to 80% of the total length of the solder connecting unit "NB": printed circuit board in which the length of the crack is more than 80% and less than or equal to 99% of the total length of the solder connecting unit "NG": printed circuit board in which the length of the crack exceeds 99% of the total length of the solder connecting unit

TABLE 1

| | | | | VARNISH 1 | VARNISH 2 | VARNISH 3 |
|---|---|---|---|---|---|---|
| THERMOSETTING RESIN COMPOSITION (PART BY MASS) | EPOXY RESIN | DOW CHEMICAL COMPANY | DER593 | 30 | 30 | 30 |
| | | DIC CORPORATION | N-690 | 40 | 40 | 40 |
| | | DIC CORPORATION | 153 | 30 | 30 | 30 |
| | CURING AGENT | DIC CORPORATION | TD-2090 | 36 (1.0 Equivalent) | 36 (1.0 Equivalent) | 36 (1.0 Equivalent) |
| | CURING ACCELERATOR | SHIKOKU CHEMICALS CORPORATION | 2E4M | 0.1 | 0.1 | 0.1 |
| | INORGANIC FILLER | SUMITOMO CHEMICAL CO., LTD. | CL303M | 30 | 30 | 30 |
| | | ADMATECHS | SO-25R | 30 | 30 | 30 |
| | ELASTICITY LOWERING AGENT | CARBOXYL GROUP-CONTAINING ETHYLENE-ACRYLIC RUBBER | DUPONT | Vamac G | 15 | | |
| | | CARBOXYL GROUP-CONTAINING NITRILE RUBBER | JSR CORPORATION | XER-32 | | 15 | |
| | | CORE-SHELL TYPE RUBBER | AICA KOGYO CO., LTD. | AC-3816N | 20 | 20 | 35 |
| | | ACRYLIC RUBBER POWDER | SEKISUI CHEMICAL CO., LTD. | SRK200 | | | |
| | | SILICONE POWDER | DOW CORNING TORAY CO., LTD. | EP-2601 | | | |
| | SOLVENT | — | MEK | 150 | 150 | 150 |

| | | | | PREPREG 1 | PREPREG 2 | PREPREG 3 |
|---|---|---|---|---|---|---|
| PHYSICAL PROPERTY OF CURED PRODUCT OF PREPREG | BENDING ELASTIC MODULUS | GPa | | 9.0 | 9.5 | 9.0 |
| | GLASS TRANSITION TEMPERATURE | ° C. | | 155 | 155 | 160 |
| | COEFFICIENT OF THERMAL EXPANSION | ppm/° C. | | 9.0 | 9.0 | 10.5 |

| | | | | VARNISH 4 | VARNISH 5 |
|---|---|---|---|---|---|
| THERMOSETTING RESIN COMPOSITION (PART BY MASS) | EPOXY RESIN | DOW CHEMICAL COMPANY | DER593 | 30 | 30 |
| | | DIC CORPORATION | N-690 | 40 | 40 |
| | | DIC CORPORATION | 153 | 30 | 30 |
| | CURING AGENT | DIC CORPORATION | TD-2090 | 36 (1.0 Equivalent) | 36 (1.0 Equivalent) |

TABLE 1-continued

|  |  |  |  |  |  |
|---|---|---|---|---|---|
|  | CURING ACCELERATOR |  | SHIKOKU CHEMICALS CORPORATION | 2E4M | 0.1 | 0.1 |
|  | INORGANIC FILLER |  | SUMITOMO CHEMICAL CO., LTD. | CL303M | 30 | 30 |
|  |  |  | ADMATECHS | SO-25R | 30 | 30 |
|  | ELASTICITY LOWERING AGENT | CARBOXYL GROUP-CONTAINING ETHYLENE-ACRYLIC RUBBER | DUPONT | Vamac G |  |  |
|  |  | CARBOXYL GROUP-CONTAINING NITRILE RUBBER | JSR CORPORATION | XER-32 |  |  |
|  |  | CORE-SHELL TYPE RUBBER | AICA KOGYO CO., LTD. | AC-3816N |  |  |
|  |  | ACRYLIC RUBBER POWDER | SEKISUI CHEMICAL CO., LTD. | SRK200 | 35 |  |
|  |  | SILICONE POWDER | DOW CORNING TORAY CO., LTD. | EP-2601 |  | 35 |
|  | SOLVENT |  | — | MEK | 150 | 150 |

|  |  |  |  | PREPREG 4 | PREPREG 5 |
|---|---|---|---|---|---|
| PHYSICAL PROPERTY OF CURED PRODUCT OF PREPREG |  | BENDING ELASTIC MODULUS | GPa | 10.0 | 8.5 |
|  |  | GLASS TRANSITION TEMPERATURE | °C. | 160 | 145 |
|  |  | COEFFICIENT OF THERMAL EXPANSION | ppm/°C. | 11.0 | 12.0 |

TABLE 2

|  |  |  |  | Example 1 | Example 2 | Example 3 |
|---|---|---|---|---|---|---|
| PHYSICAL PROPERTY OF EACH LAYER OF PRINTED WIRING BOARD | FIRST OUTERMOST INSULATING LAYER AND SECOND OUTERMOST INSULATING LAYER | PREPREG |  | PREPREG 1 | PREPREG 2 | PREPREG 3 |
|  |  | BENDING ELASTIC MODULUS | GPa | 9.0 | 9.5 | 9.0 |
|  |  | GLASS TRANSITION TEMPERATURE | °C. | 155 | 155 | 160 |
|  |  | COEFFICIENT OF THERMAL EXPANSION | ppm/°C. | 9.0 | 9.0 | 10.5 |
|  | INNER INSULATING LAYER | INNER LAYER MEMBER |  | R-1566 | R-1566 | R-1566 |
|  |  | BENDING ELASTIC MODULUS | GPa | 22 | 22 | 22 |
|  |  | GLASS TRANSITION TEMPERATURE | °C. | 145 | 145 | 145 |
|  |  | COEFFICIENT OF THERMAL EXPANSION | ppm/°C. | 12 | 12 | 12 |
| EVALUATION RESULT | BOARD STATE AFTER REFLOW CYCLE TEST | REFLOW TEMPERATURE OF 260° C., 10 CYCLES |  | OK | OK | OK |
|  | STATE OF SOLDER CONNECTING UNIT AFTER TEMPERATURE CYCLE TEST (−40° C. TO 125° C., 3000 CYCLES) | CHIP SIZE | 3216 | OK | OK | OK |
|  |  |  | 2012 | OK | OK | OK |
|  |  |  | 1608 | OK | OK | OK |

|  |  |  |  | Example 4 | Example 5 | Example 6 |
|---|---|---|---|---|---|---|
| PHYSICAL PROPERTY OF EACH LAYER OF PRINTED WIRING BOARD | FIRST OUTERMOST INSULATING LAYER AND SECOND OUTERMOST INSULATING LAYER | PREPREG |  | PREPREG 4 | PREPREG 5 | PREPREG 1 |
|  |  | BENDING ELASTIC MODULUS | GPa | 10.0 | 8.5 | 9.0 |
|  |  | GLASS TRANSITION TEMPERATURE | °C. | 160 | 145 | 155 |
|  |  | COEFFICIENT OF THERMAL EXPANSION | ppm/°C. | 11.0 | 12.0 | 9.0 |

TABLE 2-continued

|  |  |  |  |  |  |  |
|---|---|---|---|---|---|---|
|  | INNER INSULATING LAYER | INNER LAYER MEMBER |  | R-1566 | R-1566 | R-1755D |
|  |  | BENDING ELASTIC MODULUS | GPa | 22 | 22 | 21 |
|  |  | GLASS TRANSITION TEMPERATURE | ° C. | 145 | 145 | 154 |
|  |  | COEFFICIENT OF THERMAL EXPANSION | ppm/° C. | 12 | 12 | 11 |
| EVALUATION RESULT | BOARD STATE AFTER REFLOW CYCLE TEST | REFLOW TEMPERATURE OF 260° C., 10 CYCLES |  | OK | OK | OK |
|  | STATE OF SOLDER CONNECTING UNIT AFTER TEMPERATURE CYCLE TEST (−40° C. TO 125° C., 3000 CYCLES) | CHIP SIZE | 3216 | NB | NB | OK |
|  |  |  | 2012 | OK | OK | OK |
|  |  |  | 1608 | OK | OK | OK |

TABLE 3

|  |  |  |  | Example 7 | Example 8 | Example 9 |
|---|---|---|---|---|---|---|
| PHYSICAL PROPERTY OF EACH LAYER OF PRINTED WIRING BOARD | FIRST OUTERMOST INSULATING LAYER AND SECOND OUTERMOST INSULATING LAYER | PREPREG |  | PREPREG 2 | PREPREG 3 | PREPREG 4 |
|  |  | BENDING ELASTIC MODULUS | GPa | 9.5 | 9.0 | 10.0 |
|  |  | GLASS TRANSITION TEMPERATURE | ° C. | 155 | 160 | 160 |
|  |  | COEFFICIENT OF THERMAL EXPANSION | ppm/° C. | 9.0 | 10.5 | 11.0 |
|  | INNER INSULATING LAYER | INNER LAYER MEMBER |  | R-1755D | R-1755D | R-1755D |
|  |  | BENDING ELASTIC MODULUS | GPa | 21 | 21 | 21 |
|  |  | GLASS TRANSITION TEMPERATURE | ° C. | 154 | 154 | 154 |
|  |  | COEFFICIENT OF THERMAL EXPANSION | ppm/° C. | 11 | 11 | 11 |
| EVALUATION RESULT | BOARD STATE AFTER REFLOW CYCLE TEST | REFLOW TEMPERATURE OF 260° C., 10 CYCLES |  | OK | OK | OK |
|  | STATE OF SOLDER CONNECTING UNIT AFTER TEMPERATURE CYCLE TEST (−40° C. TO 125° C., 3000 CYCLES) | CHIP SIZE | 3216 | OK | OK | OK |
|  |  |  | 2012 | OK | OK | OK |
|  |  |  | 1608 | OK | OK | OK |

|  |  |  |  | Example 10 | Comparative Example 1 | Comparative Example 2 |
|---|---|---|---|---|---|---|
| PHYSICAL PROPERTY OF EACH LAYER OF PRINTED WIRING BOARD | FIRST OUTERMOST INSULATING LAYER AND SECOND OUTERMOST INSULATING LAYER | PREPREG |  | PREPREG 5 | R-1551 PREPREG OF R-1566 | R-1650D PREPREG OF R-1755D |
|  |  | BENDING ELASTIC MODULUS | GPa | 8.5 | 22 | 21 |
|  |  | GLASS TRANSITION TEMPERATURE | ° C. | 145 | 145 | 154 |
|  |  | COEFFICIENT OF THERMAL EXPANSION | ppm/° C. | 12.0 | 12 | 11 |
|  | INNER INSULATING LAYER | INNER LAYER MEMBER |  | R-1755D | R-1566 | R-1755D |
|  |  | BENDING ELASTIC MODULUS | GPa | 21 | 22 | 21 |
|  |  | GLASS TRANSITION TEMPERATURE | ° C. | 154 | 145 | 154 |
|  |  | COEFFICIENT OF THERMAL EXPANSION | ppm/° C. | 11 | 12 | 11 |
| EVALUATION RESULT | BOARD STATE AFTER REFLOW CYCLE TEST | REFLOW TEMPERATURE OF 260° C., 10 CYCLES |  | OK | OK | OK |
|  | STATE OF SOLDER CONNECTING UNIT AFTER TEMPERATURE CYCLE TEST (−40° C. TO 125° C., 3000 CYCLES) | CHIP SIZE | 3216 | OK | NG | NG |
|  |  |  | 2012 | OK | NG | NG |
|  |  |  | 1608 | OK | NB | NB |

As is clear from Table 2 and Table 3, it is found that the mounting reliability was improved in each Example while the mounting reliability was degraded in each Comparative Example.

The invention claimed is:

1. A printed wiring board comprising:
an inner insulating layer including a conductive wire;
a first outermost insulating layer disposed on a first surface of the inner insulating layer; and
a second outermost insulating layer disposed on a second surface of the inner insulating layer, wherein:
  each of the first outermost insulating layer and the second outermost insulating layer is a cured product of a prepreg, the prepreg including a thermosetting resin composition and a base material impregnated with the thermosetting resin composition,
  the thermosetting resin composition includes an elasticity lowering agent,
  the elasticity lowering agent includes at least one selected from the group consisting of ethylene-acrylic rubber including carboxyl group, nitrile rubber including carboxyl group, core-shell type rubber, acrylic rubber powers, and silicone powders,
  a bending elastic modulus of each of the first outermost insulating layer and the second outermost insulating layer ranges from ¼ to ¾, inclusive, of a bending elastic modulus of the inner insulating layer, and
  a glass transition temperature of each of the first outermost insulating layer and the second outermost insulating layer falls within ±20° C. of a glass transition temperature of the inner insulating layer.

2. The printed wiring board according to claim 1, wherein a coefficient of thermal expansion in a direction perpendicular to a thickness direction of the first outermost insulating layer and the second outermost insulating layer falls within ±30% of a coefficient of thermal expansion in a direction perpendicular to a thickness direction of the inner insulating layer.

3. The printed wiring board according to claim 1, wherein:
the thermosetting resin composition further includes an epoxy resin, a curing agent, a curing accelerator, and an inorganic filler, and
with respect to 100 parts by mass of the epoxy resin, a mass ratio of the inorganic filler ranges from 50 parts by mass to 200 parts by mass, inclusive, and a mass ratio of the elasticity lowering agent ranges from 5 parts by mass to 70 parts by mass, inclusive.

4. The printed wiring board according to claim 1, wherein:
the inner insulating layer includes an adhesive layer, a first inner layer member disposed on a first surface of the adhesive layer, and a second inner layer member disposed on a second surface of the adhesive layer,
the adhesive layer has insulating property,
the first inner layer member includes a first substrate and a first conductive wire disposed on a surface of the first substrate, and
the second inner layer member includes a second substrate and a second conductive wire disposed on a surface of the second substrate.

5. A printed circuit board comprising:
the printed wiring board according to claim 1;
an outermost conductive wire disposed on an outside surface of at least one of the first outermost insulating layer and the second outermost insulating layer; and
an electronic component that is mounted so as to electrically connect to the outermost conductive wire.

6. A prepreg used as a material for a printed wiring board, the printed wiring board including: an inner insulating layer including a conductive wire; a first outermost insulating layer disposed on a first surface of the inner insulating layer; and a second outermost insulating layer disposed on a second surface of the inner insulating layer, wherein:
a cured product of the prepreg constitutes each of the first outermost insulating layer and the second outermost insulating layer,
each of the first outermost insulating layer and the second outermost insulating layer is a cured product of a prepreg, the prepreg including a thermosetting resin composition and a base material impregnated with the thermosetting resin composition,
  the thermosetting resin composition includes an elasticity lowering agent,
  the elasticity lowering agent includes at least one selected from the group consisting of ethylene-acrylic rubber including carboxyl group, nitrile rubber including carboxyl group, core-shell type rubber, acrylic rubber powers, and silicone powders,
  a bending elastic modulus of each of the first outermost insulating layer and the second outermost insulating layer ranges from ¼ to ¾, inclusive, of a bending elastic modulus of the inner insulating layer, and
  a glass transition temperature of each of the first outermost insulating layer and the second outermost insulating layer falls within ±20° C. of a glass transition temperature of the inner insulating layer.

7. The prepreg according to claim 6, wherein a coefficient of thermal expansion in a direction perpendicular to a thickness direction of the first outermost insulating layer and the second outermost insulating layer falls within ±30% of a coefficient of thermal expansion in a direction perpendicular to a thickness direction of the inner insulating layer.

8. The prepreg according to claim 6, wherein:
the thermosetting resin composition further includes an epoxy resin, a curing agent, a curing accelerator, and an inorganic filler, and
with respect to 100 parts by mass of the epoxy resin, a mass ratio of the inorganic filler ranges from 50 parts by mass to 200 parts by mass, inclusive, and a mass ratio of the elasticity lowering agent ranges from 5 parts by mass to 70 parts by mass, inclusive.

* * * * *